(12) United States Patent
Bourdelais et al.

(10) Patent No.: US 7,001,658 B2
(45) Date of Patent: *Feb. 21, 2006

(54) HEAT SELECTIVE ELECTRICALLY CONDUCTIVE POLYMER SHEET

(75) Inventors: Robert P. Bourdelais, Pittsford, NY (US); Cheryl J. Kaminsky, Webster, NY (US); John M. Pochan, Penfield, NY (US); James F. Elman, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/424,666

(22) Filed: Apr. 28, 2003

(65) Prior Publication Data

US 2004/0213954 A1 Oct. 28, 2004

(51) Int. Cl.
  *B32B 3/20* (2006.01)
  *H01B 13/00* (2006.01)
  *H02G 3/04* (2006.01)

(52) U.S. Cl. .......................... 428/188; 216/18; 216/19; 174/95; 174/96; 174/97; 174/98

(58) Field of Classification Search ................ 428/188, 428/170, 141, 119, 172, 161, 166, 167, 163, 428/164, 192; 216/13, 18, 19; 385/132, 385/312; 252/500, 510, 511, 518; 349/79, 349/86, 88, 94, 95, 122, 124; 174/95–98; 361/679–686, 749–751, 784, 790; 343/762, 343/774, 767–771, 824–828, 789, 795–800
See application file for complete search history.

(56) References Cited

U.S. PATENT DOCUMENTS

| | | | |
|---|---|---|---|
| 4,008,300 | A | 2/1977 | Ponn |
| 4,853,277 | A | 8/1989 | Chant |
| 5,087,494 | A | 2/1992 | Calhoun et al. |
| 5,522,962 | A | 6/1996 | Koskenmaki et al. |
| 5,917,567 | A | 6/1999 | Oh et al. |
| 6,124,974 | A | 9/2000 | Burger |
| 6,132,543 | A | 10/2000 | Mohri et al. |
| 6,285,001 | B1 | 9/2001 | Fleming et al. |
| 6,591,496 | B1 * | 7/2003 | Koskenmaki et al. ......... 29/846 |
| 2003/0122111 | A1 * | 7/2003 | Glatkowski ................. 252/500 |
| 2003/0197648 | A1 * | 10/2003 | Quinn et al. ................ 343/702 |

* cited by examiner

*Primary Examiner*—Harold Pyon
*Assistant Examiner*—Patricia L. Nordmeyer
(74) *Attorney, Agent, or Firm*—Arthur E. Kluegel (57) ABSTRACT

Disclosed is an article comprising first areas of electrically conductive material and second areas of electrically conductive material raised relative to the first areas and substantially electrically isolated from the first areas, said conductive materials exhibiting a resistivity that averages less than 800 ohm/square.

26 Claims, 1 Drawing Sheet

HEAT SELECTIVE ELECTRICALLY CONDUCTIVE POLYMER SHEET

CROSS-REFERENCE TO RELATED APPLICATIONS

This application is one of a group of four applications co-filed under U.S. application Ser. Nos. 10/424,666; 10/425,005; 10/424,639; and 10/425,012, all filed on Apr. 28, 2003.

FIELD OF THE INVENTION

The invention relates to a polymer article suitable for impressing an electrically conductive pattern using imagewise application of heat and/or pressure.

BACKGROUND OF THE INVENTION

As electronic devices become smaller, the requirements for precise electrical connection at extremely fine pitch continue to increase. As an example, semiconductors, such as integrated circuits, are formed on wafers that are then cut into dice or chips that individually may be mounted on substrates. Typically, the substrate has fine electrically conductive circuit lines, and electrical and thermal contact must be made between the substrate and chip. As electronic appliances, such as computers, tape players, televisions, telephones, and other appliances become smaller, thinner, and more portable, the size requirements for semiconductors and the means for providing electrical connection between semiconductors and substrates, or between flexible circuits and rigid printed circuits, become increasingly demanding.

One method for providing electrical conductivity between two electrical elements is through the use of a Z-axis conductive sheet material, such as a Z-axis adhesive. Whether the sheet material is an elastomer or an adhesive, the continuing challenge is to keep pace with the miniaturization in the electronics industry. Z-axis conductivity can be achieved through a number of means, including dispersing conductive particles throughout a binder matrix. Where electrical connection on a very fine pitch is required, the conductive elements may be placed only where the electrodes are located, typically requiring indexing the conductive sheet to the electrodes, or the conductive elements may be placed at such close spacing, relative to the spacing of the electrodes, that indexing is not required. U.S. Pat. No. 5,087,494, (Calhoun et al) is an example of an electrically conductive adhesive tape having conductive particles placed at precise locations, on a fine pitch. The Calhoun et al '494 patent also discusses a number of available options for electrically conductive adhesive tapes.

U.S. Pat. No. 4,008,300 (Ponn) and U.S. Pat. No. 3,680,037 (Nellis, et al.), teach a dielectric sheet material having a plurality of compressible resilient conductive plugs that extend between the faces of the sheet. The sheet can be placed between circuits to make electrical connection there between. The conductive plugs of Ponn and Nellis are dispersions of conductive particles in a binder material.

U.S. Pat. No. 5,522,962 teaches conductive sheets that are conductive through the thickness but insulating in the lateral directions. While conductive materials are disclosed, they tend to have low light transmission and therefore are not particularly useful in transmission devices such as liquid crystal displays. Further, the conductive materials utilized in the invention are conductive ferromagnetic particles coated in a binder.

Metallic reflectors are often used in optical displays, such as liquid crystal displays, to even out illumination across the display and to diffusely reflect the light from the backlight or light coming in the display from the environment. Prior art reflectors include planar specular reflectors and planar diffusive reflectors. Specular reflectors include a substantially planar surface that is covered with a reflective metallic coating. Specular reflectors are characterized by an angle of incidence being substantially equal to an angle of reflection. Diffusive reflectors typically have a roughened surface which is predominately coated with a metallic reflective coating. Diffusive reflectors are characterized by reflecting and scattering incident light. Prior art diffuse reflectors typically comprise continuous metallization of a roughened polymer sheet.

The transmission-type LCD includes a backlight, typically one to two cold fluorescent bulbs at the back surface of the liquid-crystal panel. The backlight consumes a relatively large amount of power. The diffuse reflector evens out the illumination of the back light across the entire display to eliminate any hot (brighter) spots. The more efficient a reflector is at diffusing, the more even the light will be across the display. The more efficient the reflector is, minimizing the amount of light lost to transmission and absorption, the more light passes through the liquid crystal and is realized as a brighter screen. This more efficient diffuse reflector can be used for a brighter display or for less power use that extends battery life Reflection-type LCDs include a reflector for reflecting light at a back surface of the LCD, in which ambient light is reflected on the reflector to display images. The diffuse reflector reflects and diffuses the ambient light to mask any hot spots due to differences in ambient lighting across the display. The more efficient the reflection and diffusion of the reflector is, the brighter the display can be. This display does not use a backlight reducing the amount of required power but the ambient light reflection cannot produce satisfactory brightness for vivid color images and is used on calculator and other text displays.

U.S. Pat. No. 5,917,567 (Oh at al.) relates to a reflector having diffusion characteristics in which the surface of the reflector is formed with a plurality of convex portions by uniformly depositing fine spacers. The reflector is manufactured by providing a substrate, forming a thin layer of a solution of beads and polymer on the substrate, and forming a reflective layer on the thin layer. The beads form simple reflective lenses as compared to the complex lenses used in this invention. Complex lenses provide more efficient diffusion because of the multitude of lens surfaces and thus provide more efficient diffusion than can be obtained with a simple lens diffuse reflector.

It is known to produce polymeric film having a resin coated on one surface thereof with the resin having a surface texture. This kind of polymeric film is made by a thermoplastic embossing process in which raw (uncoated) polymeric film is coated with a molten resin, such as polyethylene. The polymeric film with the molten resin thereon is brought into contact with a chill roller having a surface pattern. Chilled water is pumped through the roller to extract heat from the resin, causing it to solidify and adhere to the polymeric film. During this process the surface texture on the chill roller's surface is embossed into the resin coated polymeric film. Thus, the surface pattern on the chill roller is critical to the surface produced in the resin on the coated polymeric film.

The U.S. Pat. No. 6,285,001 (Fleming et al) relates to an exposure process using excimer laser ablation of substrates to improve the uniformity of repeating microstructures on an ablated substrate or to create three-dimensional microstructures on an ablated substrate. This method is difficult to apply to create a master chill roll to manufacture complex random three-dimensional structures and is also cost prohibitive.

In U.S. Pat. No. 6,124,974 (Burger) the substrates are made with lithographic processes. This lithography process is repeated for successive photomasks to generate a three-dimensional relief structure corresponding to the desired lenslet. This procedure to form a master to create three-dimensional features into a plastic film is time consuming and cost prohibitive.

In U.S. Pat. No. 6,266,476 (Shie et al.) a monolithic element having a substrate body and a macro-optical characteristic produced by surface micro-structures. These micro-structures can be non-uniform across the lens to minimize certain lens aberrations. These non-uniform micro-structures reduce lens aberrations, but are not able to significantly alter the macro-optical characteristics of the optical body. The diffusing structures, in this invention, vary as to change the macro diffusion efficiency across the diffusion film. The diffusion elements can vary changing the diffusion characteristics of the diffusion area from diffusing most of the light to letting light pass specularly which micro-structures are unable to do.

SUMMARY OF THE INVENTION

The invention provides an article comprising a pattern of first areas of electrically conductive material and second areas of electrically conductive material raised relative to the first areas and substantially electrically isolated from the first areas, said materials exhibiting a resistivity that averages less than 800 ohm/square. The invention also provides both an article suitable for forming thereon such a pattern by imagewise application of heat and/or pressure comprising a plurality of elevated areas of electrically conductive material disposed on thermoplastic polymer pillars wherein the resistivity between adjacent areas averages greater than 2000 ohm/square and a process for forming the pattern using heat and/or pressure.

DETAILED DESCRIPTION OF THE INVENTION

The invention has numerous advantages over prior practices in the art. The invention provides an electrically conductive polymer sheet that is both thin and flexible that is conductive in the plane of the sheet. The invention materials allows a conductive pattern to be applied to the surface of the sheet by pattern wise application of heat and/or pressure. The patterned electrically conductive sheet is of sufficient conductivity that allows the sheet to be used for flexible circuits, membrane switches, display devices, radio frequency antenna and thin film transistors. Because the conductive pattern is on a flexible polymer substrate, the invention materials are ideally suited for display devices such as mobile phones that are exposed to vibration and mechanical shock. Further, because the patterned conductive sheet is flexible, the sheet can be manufactured roll to roll significantly reducing the cost compared to conductive patterned materials are applied to rigid structures such as glass or silicon.

Figure 1:
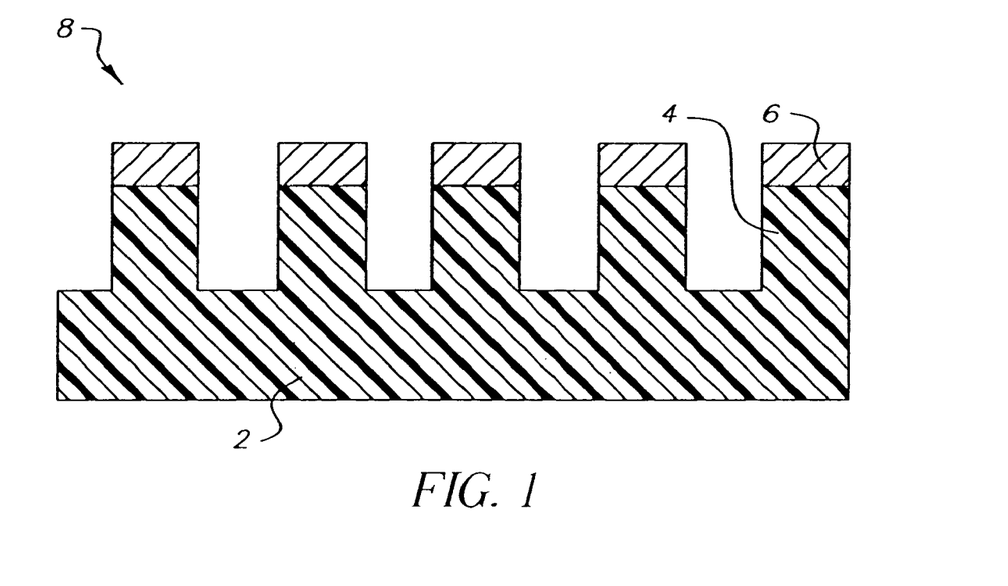
FIG. 1 illustrates a cross section of a heat selective conductive polymer sheet prior to pattern wise printing with heat.

FIG. 1 illustrates a cross section of a heat selective conductive polymer sheet 8 prior to pattern wise printing with heat. Base sheet 2 is provided with polymer pillars 4 on to which electrical conductive material 6 is applied. The conductive material 6 applied to the polymer pillars 4 are electrical insulated from each other by the air gap between the pillars.

Figure 2:
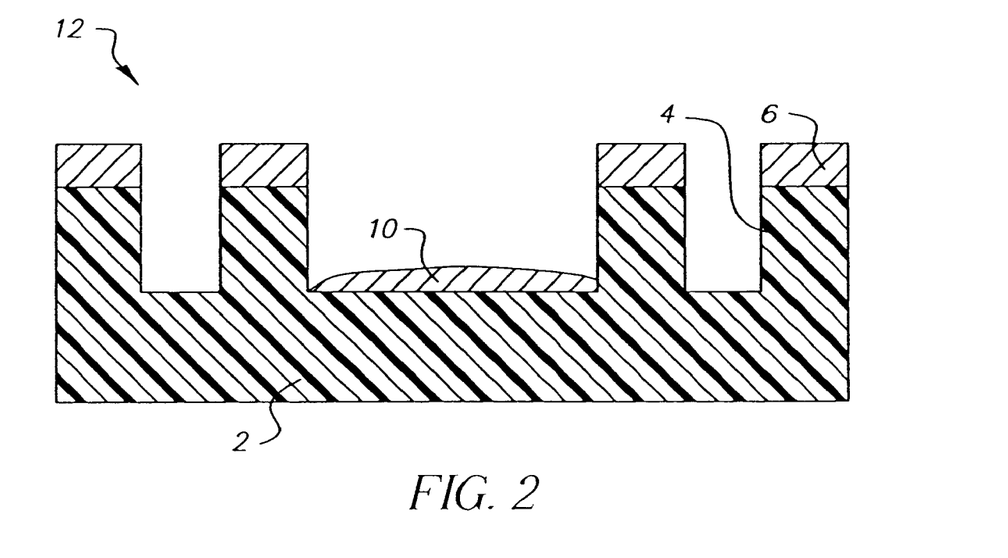
FIG. 2 illustrates a cross section of the heat selective conductive polymer sheet after pattern wise exposure to heat.

FIG. 2 illustrates a cross section of the heat selective conductive polymer sheet after pattern wise exposure to heat. Polymer pillars 4 with conductive material 6 were not pattern wise exposed to heat and therefore remain substantially unchanged. Conductive material 10 was exposed to pattern wide heat and the entire areas 10 is electrically conductive. Conductive area 10, having basically the same composition as conductive material 6, is electrically insulated from each other providing electrically conductive pattern. Further, conductive area 10, since it is below polymer pillars 4, is protected from abrasion since it remains below the surface of polymer sheet 12. The apparent rough surface of conductive area 10 is the result of some low frequency roughness created by the melted polymer pillar 4. The surface roughness of conductive area 10 does not significantly impact the electrical performance of the patterned conductive area 10.

In effect, the areas 10 constitute conduit channels that are located below the grade or upper surface of the polymer sheet.

Since the conductive pattern is applied image wise, the electrically conductive pattern can vary in direction and location allowing the invention materials to be used with other popular electrical components such as resistors, capacitors, IC chips and transistors compared to prior art electrically conductive polymer materials that are linear in nature. The conductive pattern an be applied to sheet at time of use significant reducing long lead times associated with ordering patterned conductive web materials such as sputter coated ITO. The conductive patterns can be made at the time of use and are especially valuable for the rapid creation of prototypes and the production of a small number of devices were tooling and set up costs are avoided.

An interesting aspect of the invention is the use of transparent conductive materials, which allow the invention materials to be utilized in application requiring light transmission such as rear illuminated displays. Prior art patterned conductive materials that use metal such as silver or nickel have light transmissions that are higher than the transparent polymer materials utilized in the invention. The electrical patterning of the materials of the invention can be accomplished using digital printing techniques which melt the desired areas. Two digital techniques to melt the polymer pillar in the desired pattern are resistive thermal heads and lasers. Both of these techniques can convert a digital design file containing the desired electrical pattern into a conductive pattern allowing designers and engineers to create circuits for rapid prototyping and testing of circuit designs before final design. These and other advantages will be apparent from the detailed description below.

The term "LCD" means any rear projection display device that utilizes liquid crystals to form the image. The term "diffuser" means any material that is able to diffuse specular light (light with a primary direction) to a diffuse light (light with random light direction). The term "light" means visible light. The term "diffuse light transmission" means the percent diffusely transmitted light at 500 nm as compared to the total amount of light at 500 nm of the light source. The term "total light transmission" means percentage light transmitted through the sample at 500 nm as compared to the total amount of light at 500 nm of the light source. This includes both spectral and diffuse transmission of light. The term "diffuse light transmission efficiency" means the ratio of % diffuse transmitted light at 500 nm to % total transmitted light at 500 nm multiplied by a factor of 100. The term "polymeric film" means a film comprising polymers. The term "polymer" means homo- and co-polymers. The term "average", with respect to lens size and frequency, means the arithmetic mean over the entire film surface area.

The term "transparent" means a sheet with total light transmission of 70% or greater at 500 nm. The term conductive means the ability of a material to conduct electrical current. Conductivity is the reciprocal of resistivity. Resistivity is measured in units of ohm meters or ohms/square. Conductive materials utilized in this invention generally have measured resistivity less than 5000 meters.

The divergence of light through the lens may be termed "asymmetric", which means that the divergence in the horizontal direction is different from the divergence in the vertical direction. The divergence curve is asymmetric, meaning that the direction of the peak light transmission is not along the direction $\theta=0°$, but is in a direction non-normal to the surface. There are at least three approaches available for making the light disperse asymmetrically from a lenslet diffusion film, namely, changing the dimension of the lenses in one direction relative to an orthogonal direction, offsetting the optical axis of the lens from the center of the lens, and using an astigmatic lens.

In order to provide a sheet material that contains electrically conductive patterns an article comprising a plurality of elevated areas of electrically conductive material disposed on thermoplastic polymer pillars wherein the resistivity between adjacent areas averages greater than 2000 ohm/square is preferred. The article of the invention allows for pattern wise connection of the electrically insulated conductive materials that is applied to the outermost surface of the pillars. Connecting the electrically conductive material applied to the pillars in a pattern allows for a conductive pattern to be constructed that can conduct electrical signals and current that is common to electrical components such as circuit boards, input/output devices, membrane switch pads, and imaging layers that contain cholesteric liquid crystals for example. The article of the invention also allows for customization of the patterned conductive material significantly reducing the need for long lead time, expensive pre-printed electrically conductive patterns. Further, because most of the material content of the invention comprises polymer materials, the invention materials can be manufactured and coated roll to roll significantly reducing cost. The high polymer content of the invention materials also is more durable than patterned electrical materials applied to glass or silicon, allowing for more durable devices such as PDAs and mobile phones.

The polymer pillars of the invention preferably comprise a polymer with a glass transition temperature (Tg) less than 80 degrees Celsius. A polymer Tg less than 80 degrees Celsius allows for the efficient flowing of the polymer pillars under heat and pressure without electrical damage to the conductive materials. Further polymers with a Tg less than 80 degrees Celsius generally have excellent adhesion to the conductive materials of the invention and generally are transmissive to visible light energy.

The polymer pillars of the invention preferably have a height between 5 and 100 micrometers. Polymer pillars less than 3 micrometers allow for "bridging" of the conductive materials and decrease the electrical insulation between the pillars. Polymer pillars greater than 110 micrometers have been found difficult to flow when exposed to heat and pressure and as a result, disrupt the electrical conductivity when exposed to heat and pressure pattern wise.

The thermoplastic polymer pillars preferably have conductive polymer disposed on the surface of the pillars. The conductive polymers of the invention have been shown to provide the desired electrical conductive polymer properties, are transparent to incident visible light and flow when pattern wise exposed to heat and pressure. Further, the conductive polymers can be applied to the upper most surface of the pillars. The electrically conductive polymer of the invention are selected from the group consisting of substituted or unsubstituted aniline containing polymers, substituted or unsubstituted pyrrole containing polymers, substituted or unsubstituted thiophene containing polymers. The above polymers provide the desired conductivity, adhesion to other layers in the validation device and have high light transmission. The electrically conductive material of the present invention is coated from a coating composition comprising a polythiophene/polyanion composition containing an electrically conductive polythiophene with conjugated polymer backbone component and a polymeric polyanion component. A preferred polythiophene component for use in accordance with the present invention contains thiophene nuclei substituted with at least one alkoxy group, e.g., a $C_1$–$C_{12}$ alkoxy group or a —O(CH$_2$H$_2$O)$_n$CH$_3$ group, with n being 1 to 4, or where the thiophene nucleus is ring closed over two oxygen atoms with an alkylene group including such group in substituted form. The preparation of electrically conductive polythiophene/polyanion compositions and of aqueous dispersions of polythiophenes synthesized in the presence of polyanions, as well as the production of antistatic coatings from such dispersions is described in EP 0 440 957 (and corresponding U.S. Pat. No. 5,300,575), as well as, for example, in U.S. Pat. Nos. 5,312,681; 5,354,613; 5,370,981; 5,372,924; 5,391,472; 5,403,467; 5,443,944; and 5,575,898, the disclosures of which are incorporated by reference herein.

While general compositions are described above, the polythiophene/polyanion compositions employed in the present invention are not new themselves, and are commercially available. Preferred electrically-conductive polythiophene/polyanion polymer compositions for use in the present invention include 3,4-dialkoxy substituted polythiophene/poly(styrene sulfonate), with the most preferred electrically-conductive polythiophene/polyanion polymer composition being poly(3,4-ethylene dioxythiophene)/poly (styrene sulfonate), which is available commercially from Bayer Corporation as Baytron P.

Any polymeric film-forming binder, including water soluble polymers, synthetic latex polymers such as acrylics, styrenes, acrylonitriles, vinyl halides, butadienes, and others, or water dispersible condensation polymers such as polyurethanes, polyesters, polyester ionomers, polyamides, epoxides, and the like, may be optionally employed in the conductive layer to improve integrity of the conductive layer and to improve adhesion of the antistatic layer to an underlying and/or overlying layer. Preferred binders include polyester ionomers, vinylidene chloride containing interpolymers and sulfonated polyurethanes as disclosed in U.S. Pat.

No. 6,124,083 incorporated herein by reference. The electrically-conductive polythiophene/polyanion composition to added binder weight ratio can vary from 100:0 to 0.1:99.9, preferably from 1:1 to 1:20, and more preferably from 1:2 to 1:20. The dry coverage of the electrically-conductive substituted or unsubstituted thiophene-containing polymer employed depends on the inherent conductivity of the electrically-conductive polymer and the electrically-conductive polymer to binder weight ratio. A preferred range of dry coverage for the electrically-conductive substituted or unsubstituted thiophene-containing polymer component of the polythiophene/polyanion compositions is from about 0.5 mg/m.sup.2 to about 3.5 mg/m.sup.2, this dry coverage should provide the desired electrical resistivity values before and after photographic processing while minimizing the impact of the electrically-conductive polymer on the color and optical density of the processed photographic element.

In addition to the electrically-conductive agent(s) and polymeric binder, the electrically-conductive materials of the invention may include crosslinking agents, coating aids and surfactants, dispersing aids, coalescing aids, biocides, matte particles, waxes and other lubricants. A common level of coating aid in the conductive coating formula, e.g., is 0.01 to 0.3 weight % active coating aid based on the total solution weight. These coating aids are typically either anionic or nonionic and can be chosen from many that are applied for aqueous coating. The various ingredients of the coating solution may benefit from pH adjustment prior to mixing, to insure compatibility. Commonly used agents for pH adjustment are ammonium hydroxide, sodium hydroxide, potassium hydroxide, tetraethyl amine, sulfuric acid, acetic acid, etc.

The electrically-conductive materials of the invention may be applied from either aqueous or organic solvent coating formulations using any of the known coating techniques such as roller coating, gravure coating, air knife coating, rod coating, extrusion coating, blade coating, curtain coating, slide coating, and the like. After coating, the layers are generally dried by simple evaporation, which can be accelerated by known techniques such as convection heating. Known coating and drying methods are described in further detail in Research Disclosure No. 308119, Published December 1989, pages 1007 to 1008. A preferred coating method for the application of the conductive polymers to the surface of the pillars is reverse roll coating. Reverse roll coating of the pillars has been shown to provide excellent coating quality and uniformity as well as keeping the conductive polymers located on the top of the polymers were the conductive materials are most efficient. Patterned coating methods such as stripe coating, spray coating, ink jet deposition or thermal transfer are also preferred as they provide precision patterns to the surface of the pillars. Electophotographic coating of the uppermost surface of the pillars is preferred because the peaks of the polymer pillars generally accept the desired charge, allowing oppositely charged conductive toners to adhere to the peaks of the polymer pillars.

In another embodiment of the invention, the conductive material comprises metal. Metal has the advantage of being high conductive and can be made transparent if the thickness of the metal deposited on the pillars is less than 1000 angstroms. Preferably, the metallic reflectivity is from a metal. Metals, for example aluminum, copper, silver, platinum, gold, and brass, are preferred because of their high reflectivity in relatively thin layers. In another embodiment, the metallic reflectivity is an alloy. Using an alloy is preferred because the reflectance and mechanical properties can be tailored by using two or more metals with different properties. Most preferably, the metallic reflectivity is from silver or aluminum. Silver and aluminum can be easily vacuum coated onto moving webs and have high reflectivity for thin films. Further, a polymer mask may be applied to the sheet, covering the space between the pillars. After applying metal to the sheet, the mask is removed, leaving metal on the peaks of the pillars and not in the space between the pillars.

Preferably, the metal thickness is between 10 and 5,000 angstroms. A layer with thickness less than 7 angstroms tends to be very translucent and therefore the pattern of diffuse and specular reflectivity is difficult to see and read. A reflective layer thickness of over 5,080 angstroms does not give an added amount of total reflectivity and uses more materials. Furthermore, when melting the protuberances covered in metal, when the metallic layer is very thick (thicker than 5,080 angstroms) it becomes more difficult to apply heat and pressure to melt the pillars resulting in a pattern of diffuse and specular reflectivity that is not fully formed. Most preferred, the metal has a thickness of 500 to 1,000 angstroms. It has been shown that this range can deliver the desired reflectivity properties while minimizing material and manufacturing costs. Additionally, the conductive metal is preferably applied in a matrix such as gelatin or PVA. The conductive metal is "sintered" during application of heat during pattern wise printing of the conductive pillars. The conductive materials may also be conductive inks (which contain metallic compounds) that are printed to the top surface of the pillars.

In another preferred embodiment, the conductive material is present between the polymer pillars. It has been shown that conductive materials of the invention applied between the pillars improves the conductivity of the pattern after application of heat and pressure. Application of the conductive materials to both the peaks and exposed area between the peaks is accomplished by coating or metalization methods that coat directionally as compared to sputtering, which has been shown to coat the sides of the polymer pillars. Before application of the pattern wise heat and pressure, conductive materials applied between the pillars does not change the electrical resistivity unless a conductive bridge is made between the pillars. A cylindrical pillar, with a height of greater than 20 micrometers has been shown to reduce unwanted bridging in a metal vacuum deposition process, thus allowing conductive materials to be located in the space between the pillars.

The polymer pillars have a diameter or thickness in the plane of the sheet between 1 and 100 micrometers. Diameters less than 1 micrometer are difficult to pattern. Above 100 micrometers, the printing resolution of the sheet is reduced. The most preferred diameter is between 10 and 40 micrometers. This diameter range provides ease of patterning and excellent resolution of the conductive pattern.

The polymer pillars preferably may be of one size or may vary in one of the following; length, height, shape, frequency, composition, slope, aspect ratio and primary direction. By varying the size of the pillars, it has been found that patterning efficiency can be improved. For example, a polymer sheet containing two populations of polymer pillars. One population at a height from the base of the sheet at 10 micrometers and the other population at 20 micrometers. While the two populations are electrically isolated from each other, upon pattern wise heating, the patterning is accomplished 12% faster compared to one population of polymer pillars at a height of 20 micrometers.

In a preferred embodiment, the pillars are triangular in shape. Triangle shaped pillars have been shown to provide excellent conductive patterns and can direct incident visible transmitted light energy. In another preferred embodiment, the top of the pillars are convex or concave. Both concave and convex pillars allow for the deposition of additional conductive material compared to pillars with a flat top.

The preferred aspect ratio of the pillars is between 0.8 and 5.0. Aspect ratios less than 0.75 have been shown to be difficult to achieve desired discontinuous deposition of the conductive materials to the pillars. Aspect ratios greater than 5.0 are difficult to electrically pattern. The slope of the side of the pillars preferably is between 70 and 90 degrees. Slopes less than 60 degrees have been shown to contain conductive materials after vacuum deposition of metal or solution coating of a conductive polymer, for example. A slope of greater than 90 degrees is very difficult to achieve during the formation process of the pillars.

In a preferred embodiment, the light transmission of the article is greater than 85%. A light transmission greater than 85% allows for the conductive patterned article to also be transmissive to light enabling transparent membrane switching circuits for example.

After pattern wise heating the article electrically conductive material deposited on polymer pillars, the resulting article is one were there exists continuous areas of conductive materials and areas that are electrically isolated from the conductive areas. An article comprising first areas of electrically conductive material that averages less than 800 ohm/square and second areas of raised electrically conductive material substantially electrically isolated from the first areas and from each other is preferred. The electrically conductive material on the polymer pillars are isolated from each other, thus are electrically insulated from each other, yet there exists enough conductive material on the pillars, that after melting the pillars, the electrically conductive material forms electrical connections that can be patterned to form a circuit.

In a preferred embodiment, the electrically conductive material averages less than 300 ohms/square. At resistivity less than 300 ohms/square, the electrically conductive material can be effectively utilized for a circuit without generation of too much resistive heat, which could impact the mechanical properties of the polymer materials utilized in the invention. Conductive polymers, matrix materials containing salts or metallic compounds and conductive inks are preferred materials to achieve electrical resistivity less than 300 ohms/square.

In another preferred embodiment of the invention, the electrically conductive material averages less than 10 ohms/square. At resistivity less than 10 ohms/square, the invention materials being to approach the transmission efficiency of printed circuit boards. Electrical resistivity less than 10 ohms/square generally require the use of metals at a thickness that does not allow high light transmission.

Preferably, the article containing both the first and second areas has a light transmission of greater than 85%. Light transmission greater than 85% provides both electrical conductivity and light transmission and can be utilized for applications requiring electrical patterning and visible light transmission. Examples include membrane switches that are rear illuminated, security cards and transmission display devices such as LCD, OLED and rear projection screens.

The conductive materials are preferably protected with an overcoat material. By protecting the conductive material, scratching and de-lamination of the conductive material is avoided to produce a rugged conductive sheet. Further, by protecting the conductive material, a secondary coating surface, adjacent to the protective layer can be utilized for auxiliary coatings or printing. Examples of coatings or printing include imaging layers, printed membrane circuit designs, coatings of cholesteric liquid crystal materials, and microlens arrays to manage the output of the transmitted light.

The protective overcoat layer preferably has a pencil hardness of greater than 2H. A pencil hardness greater than 2H resists many of the scratching forces caused during device assembly or actual use. Scratching of the overcoat layer will cause unwanted disruptions to the transmitted light and thus will reduce the optical utility of the invention. The protective overcoat preferably has a surface roughness less than 0.18 micrometers. Surface roughness greater than 0.20 micrometers has been shown to diffuse transmitted light and reduce the backlight intensity of membrane switches for example. Additionally, surface roughness less than 0.18 provides an excellent surface for auxiliary coatings or printing.

The protective overcoat preferably has a resistivity greater than 5000 ohm meters. A resistivity greater than 5000 ohm meters provides sufficient electrical current flow resistance to prevent shorts in a circuit, current drain or unwanted electrical fields. The protective overcoat preferably has a surface energy less than 40 dynes/$cm^2$. By providing a surface energy less than 40 dynes/$cm^2$, water and other aqueous solvents which would change the resistivity of the conductive material form beads on the surface of the overcoat and can easily be removed.

The protective overcoat layer may consist of suitable material that protects the image from environmental solvents, resists scratching, and does not interfere with the light transmission quality. The protective overcoat layer is preferably applied to the conductive material in either a uniform coating or a pattern wise coating. In a preferred embodiment of the invention the protective overcoat is applied in the presence of an electric field and fused to the topmost layer causing the transparent polymer particles to form a continuous polymeric layer is preferred. An electrophotographic toner applied polymer is preferred, as it is an effective way to provide a pattern wise thin layer.

In another embodiment, the protective overcoat layer is pattern wise coatable from aqueous solution and forms a continuous, water-impermeable protective layer in a post-process fusing step. The protective overcoat layer is preferably formed by coating polymer beads or particles of 0.1 to 50 μm in average size together with a polymer latex binder on the emulsion side of a sensitized photographic product. Optionally, a small amount of water-soluble coating aids (viscosifiers, surfactants) can be included in the layer, as long as they leach out of the coating during processing. After coating the sheet is treated in such a way as to cause fusing and coalescence of the coated polymer beads, by heat and/or pressure (fusing), solvent treatment, or other means so as to form the desired continuous, water impermeable protective layer.

Examples of suitable polymers from which the polymer particles used in protective overcoat layer can be selected include poly(vinyl chloride), poly(vinylidene chloride), poly(vinyl chloride-co-vinylidene chloride), chlorinated polypropylene, poly(vinyl chloride-co-vinyl acetate), poly(vinyl chloride-co-vinyl acetate-co-maleic anhydride), ethyl cellulose, nitrocellulose, poly(acrylic acid) esters, linseed oil-modified alkyd resins, rosin-modified alkyd resins, phenol-modified alkyd resins, phenolic resins, polyesters, poly(vinyl butyral), polyisocyanate resins, polyurethanes, poly(vinyl acetate), polyamides, chroman resins, dammar gum, ketone resins, maleic acid resins, vinyl polymers, such as polystyrene and polyvinyltoluene or copolymer of vinyl polymers with methacrylates or acrylates, poly(tetrafluoroethylene-hexafluoropropylene), low-molecular weight polyethylene, phenol-modified pentaerythritol esters, poly(styrene-co-indene-co-acrylonitrile), poly(styrene-co-indene), poly(styrene-co-acrylonitrile), poly(styrene-co-butadiene), poly(stearyl methacrylate) blended with poly(methyl methacrylate), copolymers with siloxanes and polyalkenes. These polymers can be used either alone or in combination. In a preferred embodiment of the invention, the polymer comprises a polyester or poly(styrene-co-butyl acrylate). Preferred polyesters are based on ethoxylated and/or propoxylated bisphenol A and one or more of terephthalic acid, dodecenylsuccinic acid and fumaric acid as they form an acceptable protective overcoat layer that generally survives the rigors of a packaging label.

To increase the abrasion resistance of the protective overcoat layer, polymers which are cross-linked or branched can be used. For example, poly(styrene-co-indene-co-divinylbenzene), poly(styrene-co-acrylonitrile-co-divinylbenzene), or poly(styrene-co-butadiene-co-divinylbenzene) can be used.

The polymer particles for the protective overcoat layer should be transparent, and are preferably colorless. But it is specifically contemplated that the polymer particle can have some color for the purposes of color correction, or for special effects. Thus, there can be incorporated into the polymer particle dye which will impart color. In addition, additives can be incorporated into the polymer particle which will give to the overcoat desired properties. For example, a UV absorber can be incorporated into the polymer particle to make the overcoat UV absorptive, thus protecting the sheet from UV induced fading or blue tint can be incorporated into the polymer particle to offset the native yellowness of the gelatin used in the gelatin salt conductive material.

In addition to the polymer particles, which form the protective overcoat layer, there can be combined with the polymer composition other particles which will modify the surface characteristics of the element. Such particle are solid and nonfusible at the conditions under which the polymer particles are fused, and include inorganic particles, like silica, and organic particles, like methylmethacrylate beads, which will not melt during the fusing step and which will impart surface roughness to the overcoat.

The surface characteristics of the protective overcoat layer are in large part dependent upon the physical characteristics of the polymer which forms the toner and the presence or absence of solid, nonfusible particles. However, the surface characteristics of the overcoat also can be modified by the conditions under which the surface is fused. For example, the surface characteristics of the fusing member that is used to fuse the toner to form the continuous overcoat layer can be selected to impart a desired degree of smoothness, texture or pattern to the surface of the element. Thus, a highly smooth fusing member will give a glossy surface to the imaged element, a textured fusing member will give a matte or otherwise textured surface to the element, a patterned fusing member will apply a pattern to the surface of the article.

Suitable examples of the polymer latex binder include a latex copolymer of butyl acrylate, 2-acrylamido-2-methylpropanesulfonate, and acetoacetoxyethylmethacrylate. Other latex polymers which are useful include polymers having a 20 to 10,000 nm diameter and a Tg of less than 60° C. suspended in water as a colloidal suspension.

Examples of suitable coating aids for the protective overcoat layer include any water soluble polymer or other material that imparts appreciable viscosity to the coating suspension, such as high MW polysaccharide derivatives (e.g. xanthan gum, guar gum, gum acacia, Keltrol (an anionic polysaccharide supplied by Merck and Co., Inc.) high MW polyvinyl alcohol, carboxymethylcellulose, hydroxyethylcellulose, polyacrylic acid and its salts, polyacrylamide, etc). Surfactants include any surface active material that will lower the surface tension of the coating preparation sufficiently to prevent edge-withdrawal, repellencies, and other coating defects. These include alkyloxy- or alkylphenoxypolyether or polyglycidol derivatives and their sulfates, such as nonylphenoxypoly(glycidol) available from Olin Matheson Corporation or sodium octylphenoxypoly(ethyleneoxide) sulfate, organic sulfates or sulfonates, such as sodium dodecyl sulfate, sodium dodecyl sulfonate, sodium bis(2-ethylhexyl)sulfosuccinate (Aerosol OT), and alkylcarboxylate salts such as sodium decanoate.

In another embodiment, the application of synthetic latex to the conductive materials to form a protective overcoat layer is preferred. A coating of synthetic latex has been shown to provide an acceptable protective overcoat layer and can be coated in an aqueous solution eliminating exposure to solvents. The coating of latex has been shown to provide an acceptable protective overcoat layer for conductive circuits. Preferred synthetic latexes for the protective overcoat layer are made by emulsion polymerization techniques from styrene butadiene copolymer, acrylate resins, and polyvinyl acetate. The preferred particles size for the synthetic latex ranges from 0.05 to 0.15 µm. The synthetic latex is applied to the outermost layer of the silver halide imaging layers by known coating methods that include rod coating, roll coating and hopper coating. The synthetic latexes must be dried after application and must dry transparent so as not to interfere with the quality of the transmitted light energy.

In a preferred embodiment, the conductive material comprises a pigment or dye. Pigments or dye provide coloration to the conductive material creating contrast difference between the insulating areas of the article and the conductive materials. Increasing the transmitted light contrast with a white pigment or carbon black provides allows for a higher contrast image or the ability to lower the illuminant output.

The polymer pillars of the invention preferably comprise thermoplastic polymers. Thermoplastic polymers are preferred as they are generally lower in cost compared to prior art glass, have excellent optical properties and can be efficiently formed into sheets utilizing an extrusion roll molding process were melted polymer is cast against a patterned precision roll forming integral conduits. Preferred polymers for the formation of the complex lenses include polyolefins, polyesters, polyamides, polycarbonates, cellulosic esters, polystyrene, polyvinyl resins, polysulfonamides, polyethers, polyimides, polyvinylidene fluoride, polyurethanes, polyphenylenesulfides, polytetrafluoroethylene, polyacetals, polylatic acid, liquid crystal polymers, cyclo-olefins, polysulfonates, polyester ionomers, and polyolefin ionomers. Copolymers and/or mixtures of these polymers to improve mechanical or optical properties can be used. Preferred polyamides for the polymer pillars include nylon 6, nylon 66, and mixtures thereof. Copolymers of polyamides are also suitable continuous phase polymers. An example of a useful polycarbonate is bisphenol-A polycarbonate. Cellulosic esters suitable for use as the continuous phase polymer of the complex lenses include cellulose nitrate, cellulose triacetate, cellulose diacetate, cellulose acetate propionate, cellulose acetate butyrate, and mixtures or copolymers thereof. Preferred polyvinyl resins include polyvinyl chloride, poly(vinyl acetal), and mixtures thereof. Copolymers of vinyl resins can also be utilized. Preferred polyesters for the complex lens of the invention include those produced from aromatic, aliphatic or cycloaliphatic dicarboxylic acids of 4–20 carbon atoms and aliphatic or alicyclic glycols having from 2–24 carbon atoms. Examples of suitable dicarboxylic acids include terephthalic, isophthalic, phthalic, naphthalene dicarboxylic acid, succinic, glutaric, adipic, azelaic, sebacic, fumaric, maleic, itaconic, 1,4-cyclohexanedicarboxylic, sodiosulfoisophthalic and mixtures thereof. Examples of suitable glycols include ethylene glycol, propylene glycol, butanediol, pentanediol, hexanediol, 1,4-cyclohexanedimethanol, diethylene glycol, other polyethylene glycols and mixtures thereof.

The preferred method of providing electrically patterned article containing raised areas that are electrically insulated from the lower patterned conductive areas is with the application of heat and or pressure to the surface of the thermoplastic pillars. The application of heat, above the Tg of the thermoplastic, allows the thermoplastic to flow, creating connections between the conductive materials deposited on the pillars.

Preferably, a resistive thermal head applies the heat and/or pressure. The resistive thermal head, such as a print head found in a thermal printer, uses heat and pressure to melt the polymer pillars. As the printer prints, the printer head heats the polymer sheet and supplies pressure to deform or completely melt the polymer pillars. This process is preferred because it has accurate resolution, can create clear areas or add color at the same time as melting the lenses, and uses heats and pressures to melt a range of polymers. The resolution of the pattern depends on the resolution of the print head. A useful resolution is a 120 dots/cm thermal print head. In another embodiment, colored dyes are transferred to the surface of the conductive materials to change the color of the transmitted light, improve the contrast of the electrically conductive pattern and add decorative color to the article.

In another embodiment, the conductive patterns are created by laser energy, melting the pillars by heating the conductive materials and or the polymer pillars. Addenda may be added to the polymer pillars and or the conductive materials to absorb the laser light energy. Lasers are preferred because of the printing resolution of a laser printing engine compared to thermal resistive heads.

In another preferred embodiment of the invention, the application of heat comprises a heat embossing roller or plate. A metallic roller or plate containing the desired pattern is applied to the invention material in sheet or roll form, "printing" the desired pattern on the invention materials. The application of heat utilizing a roller or plate is preferred because of the efficiency and speed of the patterning compared to lasers or resistive thermal heads.

The article of the invention may also be used in conjunction with a light diffuser, for example a bulk diffuser, a lenticular layer, a beaded layer, a surface diffuser, a holographic diffuser, a micro-structured diffuser, another lens array, or various combinations thereof. A diffuser film disperses, or diffuses, the light, thus destroying any diffraction pattern that may arise from the addition of an ordered periodic lens array.

The article of the present invention may be used in combination with a film or sheet made of a transparent polymer. Examples of such polymer are polyesters such as polycarbonate, polyethylene terephthalate, polybutylene terephthalate and polyethylene naphthalate, acrylic polymers such as polymethyl methacrylate, and polyethylene, polypropylene, polystyrene, polyvinyl chloride, polyether sulfone, polysulfone, polyacrylate and triacetyl cellulose. The transparent polymeric film of the invention can also include, in another aspect, one or more optical coatings to improve optical transmission through one or more conduits. It is often desirable to coat a diffuser with a layer of an anti-reflective (AR) coating in order to raise the efficiency of the article.

The article of the present invention may be incorporated with e.g. an additive or a lubricant such as silica for improving the surface-slipperiness of the film within a range not to deteriorate the optical characteristics to vary the light-scattering property with an incident angle. Examples of such additive are organic solvents such as xylene, alcohols or ketones, fine particles of an acrylic resin, silicone resin or Δ metal oxide or a filler.

The article of the present invention usually has optical anisotropy. The polymer sheet containing thermoplastic conduits are generally optically anisotropic materials exhibiting optical anisotropy having an optic axis in the drawing direction. The optical anisotropy is expressed by the product of the film thickness d and the birefringence Δn which is a difference between the refractive index in the slow optic axis direction and the refractive index in the fast optic axis direction in the plane of the film, i.e. Δn*d (retardation). The orientation direction coincides with the drawing axis in the film of the present invention. The drawing axis is the direction of the slow optic axis in the case of a thermoplastic polymer having a positive intrinsic birefringence and is the direction of the fast optic axis for a thermoplastic polymer having a negative intrinsic birefringence. There is no definite requirement for the necessary level of the value of Δn.*d since the level depends upon the application of the film.

In the manufacturing process for this invention, preferred conduit polymers are melt extruded from a slit die. In general, a T-die or a coat hanger die are preferably used. The process involves extruding the polymer or polymer blend through a slit die and rapidly quenching the extruded web upon a chilled casting drum with the preferred conduit geometry so that the conduit polymer component of the transparent sheet are quenched below their glass solidification temperature and retain the shape of the desired conduits.

A method of fabricating the polymer conduits was developed. The preferred approach comprises the steps of providing a positive master extrusion roll having a plurality of conduits. The sheet is replicated from the master extrusion roller by casting the desired molten polymeric material to the face of the extrusion roll, cooling the desired polymer below the Tg of the polymer and then striping the polymer sheet containing the conduits from the extrusion roll. The patterned roll is created by machine the negative of the pattern into the roller utilizing precision machine techniques such as ion beam milling r diamond turning. The negative of the desired conduit pattern may also be machined into a thin metallic sheet and then wrapped around a roller. The pillars of the invention may also be created by hot embossing, UV cure polymers, vacuum forming or injection molding.

Because the invention materials can be both conductive and light transmissive, the invention may be used in conjunction with any liquid crystal display devices, typical arrangements of which are described in the following. Liquid crystals (LC) are widely used for electronic displays. In these display systems, an LC layer is situated between a polarizer layer and an analyzer layer and has a director exhibiting an azimuthal twist through the layer with respect to the normal axis. The analyzer is oriented such that its absorbing axis is perpendicular to that of the polarizer. Incident light polarized by the polarizer passes through a liquid crystal cell is affected by the molecular orientation in the liquid crystal, which can be altered by the application of a voltage across the cell. By employing this principle, the transmission of light from an external source, including ambient light, can be controlled. The energy required to achieve this control is generally much less than that required for the luminescent materials used in other display types such as cathode ray tubes. Accordingly, LC technology is used for a number of applications, including but not limited to digital watches, calculators, portable computers, electronic games for which light weight, low power consumption and long operating life are important features.

Active-matrix liquid crystal displays (LCDs) use thin film transistors (TFTs) as a switching device for driving each liquid crystal pixel. These LCDs can display higher-definition images without cross talk because the individual liquid crystal pixels can be selectively driven. Optical mode interference (OMI) displays are liquid crystal displays, which are "normally white," that is, light is transmitted through the display layers in the off state. Operational mode of LCD using the twisted nematic liquid crystal is roughly divided into a birefringence mode and an optical rotatory mode. "Film-compensated super-twisted nematic" (FSTN) LCDs are normally black, that is, light transmission is inhibited in the off state when no voltage is applied. OMI displays reportedly have faster response times and a broader operational temperature range.

Ordinary light from an incandescent bulb or from the sun is randomly polarized, that is, it includes waves that are oriented in all possible directions. A polarizer is a dichroic material that functions to convert a randomly polarized ("unpolarized") beam of light into a polarized one by selective removal of one of the two perpendicular plane-polarized components from the incident light beam. Linear polarizers are a key component of liquid-crystal display (LCD) devices.

There are several types of high dichroic ratio polarizers possessing sufficient optical performance for use in LCD devices. These polarizers are made of thin sheets of materials which transmit one polarization component and absorb the other mutually orthogonal component (this effect is known as dichroism). The most commonly used plastic sheet polarizers are composed of a thin, uniaxially-stretched polyvinyl alcohol (PVA) film which aligns the PVA polymer chains in a more-or-less parallel fashion. The aligned PVA is then doped with iodine molecules or a combination of colored dichroic dyes (see, for example, EP 0 182 632 A2, Sumitomo Chemical Company, Limited), which adsorb to and become uniaxially oriented by the PVA to produce a highly anisotropic matrix with a neutral gray coloration. To mechanically support the fragile PVA film it is then laminated on both sides with stiff layers of triacetyl cellulose (TAC), or similar support.

Contrast, color reproduction, and stable gray scale intensities are important quality attributes for electronic displays, which employ liquid crystal technology. The primary factor limiting the contrast of a liquid crystal display is the propensity for light to "leak" through liquid crystal elements or cell, which are in the dark or "black" pixel state. Furthermore, the leakage and hence contrast of a liquid crystal display are also dependent on the angle from which the display screen is viewed. Typically the optimum contrast is observed only within a narrow viewing angle centered about the normal incidence to the display and falls off rapidly as the viewing angle is increased. In color displays, the leakage problem not only degrades the contrast but also causes color or hue shifts with an associated degradation of color reproduction. In addition to black-state light leakage, the narrow viewing angle problem in typical twisted nematic liquid crystal displays is exacerbated by a shift in the brightness-voltage curve as a function of viewing angle because of the optical anisotropy of the liquid crystal material.

The article of the invention was measured for transmission with the Hitachi U4001 UV/Vis/NIR spectrophotometer equipped with an integrating sphere. The total transmittance spectra were measured by placing the samples at the beam port with the front surface with conduits towards the integrating sphere. A calibrated 99% diffusely reflecting standard (NIST-traceable) was placed at the normal sample port. The diffuse transmittance spectra were measured in like manner, but with the 99% tile removed. The diffuse reflectance spectra were measured by placing the samples at the sample port with the coated side towards the integrating sphere. In order to exclude reflection from a sample backing, nothing was placed behind the sample. All spectra were acquired between 350 and 800 nm. As the diffuse reflectance results are quoted with respect to the 99% tile, the values are not absolute, but would need to be corrected by the calibration report of the 99% tile.

Percentage total transmitted light refers to percent of light that is transmitted though the sample at all angles. Diffuse transmittance is defined as the percent of light passing though the sample excluding a 2.5 degree angle from the incident light angle. The diffuse light transmission is the percent of light that is passed through the sample by diffuse transmittance. Diffuse reflectance is defined as the percent of light reflected by the sample. The percentages quoted in the examples were measured at 500 nm. These values may not add up to 100% due to absorbencies of the sample or slight variations in the sample measured.

Embodiments of the invention may provide not only improved light reflection and diffuse reflection but also a reflection film of reduced thickness.

The entire contents of the patents and other publications referred to in this specification are incorporated herein by reference.

EXAMPLES

In this example, a polymer sheet containing polyethylene 20 micrometer circular polymer pillars was formed. To the top of the polymer pillars, 500 angstroms of metallic silver was deposited. The polymer sheet containing polymer pillars with metallic silver was then pattern wise printed utilizing a resistive thermal print head. This example will demonstrate the efficiency and utility of the electrically patterned sheet.

The polymer sheet containing polymer pillars was constructed by creating a copper roller with a pattern of circular depression (the negative of the desired pattern) then extruding a polyethylene polymer onto the roller and transferring it to a polycarbonate base material. The polymer pillars were 20 micrometers in height measured from the base of the sheet, and had a diameter of 20 micrometers and a spacing of 10 micrometers in the plane of the sheet. The polycarbonate base material with the polyethylene polymer pillars was then metallized with vacuum deposited metallic silver at a thickness of 500 angstroms.

The 20 micrometer pillar patterned roll was extrusion coated using a polyolefin polymer from a coat hanger slot die comprising substantially 99.0% LDPE (Eastman Chemical grade D4002P), 0.5% Zinc Oxide and 0.5% of calcium stearate onto a 100 micrometer transparent polycarbonate web with a % light transmission of 94.6%.

The metal-coated pillars were then pattern wise printed using heat and pressure to create areas of electrical conductivity. The pillars were pattern wise printed using Kodak model 8670 PS Resistive Thermal Printer. The thermal resistive print head applied pattern wise heat and pressure to the surface of the metallized polymer pillars melting the polyethylene pillars and connecting the silver. The pattern was a series of parallel 10 cm lines with a line width of 200 micrometers and a line spacing of 20 mm.

The structure of the electrically patterned article was as follows:
Metallic silver
Polyethylene pillars selectively modified
Polycarbonate base The resistivity of the conductive 10 cm lines was measured using a FLUKE model 300 multimeter which is a two probe contact method of measuring resistivity. The resistivity average for 10 lines was 18.4 ohms with a range of 2.1 ohms. The resistivity of the polymer pillars that were not melted (area between the patterned lines) was greater than 5000 measured over the 10 cm. This example clearly demonstrates the ability to heat and or pressure print the article of the invention to achieve conductive patterns. The resistivity of 18.4 ohms allows the invention material to function as a circuit and the circuit can be patterned at the time of use compared with ordering pre-printed circuit boards. Further, because the invention materials substantially comprise polymer, they are flexible, impact resistant and light in weight compared to glass substrates. Because the conductive pattern was an average of 6.1 micrometers below the surface of the polymer pillars, the conductive pattern is protected from abrasion and scratching that might occur in use and assembly into a device.

While the example was directed at a metallic conductive materials, polymer conductive materials could have been applied to the top of the pillars, allowing the invention materials to be both conductive and transparent. Transparent patterned conductive materials are useful in rear illumination displays such as LCD, electro-luminance, membrane switches and projection screens. Further, the thermal resistive head printing of the lines could have also transferred a colored dye or protective polymer such as urethane to provide protection to the delicate conductive silver material further improving the durability and reliability of the invention materials.

PARTS LIST

2. Base sheet
4. Polymer pillar
6. Conductive material
8. Heat selective conductive polymer sheet prior to pattern wise printing with heat
10. Conductive area
12. Patterned conductive polymer sheet

What is claimed is:

1. An article suitable for forming thereon a desired electrically conductive pattern by imagewise application of heat and/or pressure comprising a plurality of elevated areas of electrically conductive material deposited on thermoplastic polymer pillars wherein the conductive material exhibits a resistivity that averages less than 800 ohm/square, the resistivity between adjacent elevated areas averages greater than 2000 ohm/square, and wherein said polymer pillars have a Tg less than 80 degrees Celsius.

2. The article of claim 1 wherein the resistivity of said electrically conductive materials averages less than 300ohms/square.

3. The article of claim 1 wherein the resistivity of said electrically conductive materials average less than 10 ohms/square.

4. The article of claim 1 wherein said article has a light transmission greater than 85%.

5. The article of claim 1 wherein the height of said pillars is between 5 and 100 micrometers.

6. The article of claim 1 wherein said conductive material comprises an electronically conductive polymer selected from the group consisting of substituted or unsubstituted aniline containing polymers, substituted or unsubstituted pyrrole containing polymers, substituted or unsubstituted thiophene containing polymers.

7. The article of claim 6 wherein said electronically conductive polymer is selected from the group consisting of poly(3,4-ethylene dioxythiophene styrene sulfonate), poly (pyrrole styrene sulfonate) and poly(3,4-ethylene dioxypyrrole styrene sulfonate).

8. The article of claim 1 comprising a first area and a second area of conductive materials raised above the first area, wherein at least one of said conductive materials comprises metal.

9. The article of claim 1 wherein said first area of electrically conductive material further comprises a polymer protective overcoat.

10. The article of claim 1 wherein said polymer pillars have a height between 5 and 100 micrometers.

11. The article of claim 1 wherein said conductive material comprises an electronically conductive polymer selected from the group consisting of substituted or unsubstituted aniline containing polymers, substituted or unsubstituted pyrrole containing polymers, substituted or unsubstituted thiophene containing polymers.

12. The article of claim 11 wherein said electronically conductive polymer is selected from the group consisting of poly(3,4-ethylene dioxythiophene styrene sulfonate), poly (pyrrole styrene sulfonate) and poly(3,4-ethylene dioxypyrrole styrene sulfonate).

13. The article of claim 1 wherein at least one of said conductive materials comprises metal.

14. The article of claim 1 wherein conductive material is present between said polymer pillars.

15. The article of claim 1 wherein each of said polymer pillars has a diameter of between 1 and 100 micrometers.

16. The article of claim 1 wherein each of said pillars is triangular in shape.

17. The article of claim 1 wherein the top of said pillars is concave or convex.

18. The article of claim 1 wherein said article has a light transmission greater than 85%.

19. The article of claim 1 wherein the aspect ratio of said pillars is between 0.8 and 5.0.

20. The article of claim 1 wherein the slope of the side of said pillar is between 70 and 90 degrees from the vertical.

21. The article of claim 1 wherein the first and second areas are viewable from a point above the article.

22. A process for creating an article with an electrically conductive area comprising providing an article comprising a plurality of elevated areas of electrically conductive material disposed on thermoplastic polymer pillars wherein the resistivity between adjacent areas averages greater than 2000 ohm/square and applying heat and/or pressure in a predetermined pattern to form desired areas of conductivity averaging less than 800 ohm/square, and wherein said polymer pillars have a Tg less than 80 degrees Celsius.

23. The process of claim 22 wherein said application of heat employs a thermal resistive head.

24. The process of claim 22 wherein said application of heat employs a laser.

25. The process of claim 22 wherein said application of heat employs a heated embossing roller or plate.

26. The process of claim 22 wherein said pattern comprises greater than 40 lines per cm.

* * * * *